US010459549B2

(12) United States Patent
Kho et al.

(10) Patent No.: US 10,459,549 B2
(45) Date of Patent: Oct. 29, 2019

(54) TOUCH SENSITIVE ELEMENT AND DISPLAY DEVICE INCLUDING THE SAME

(71) Applicant: LG Display Co., Ltd., Seoul (KR)

(72) Inventors: YuSeon Kho, Seoul (KR); YongWoo Lee, Goyang-si (KR); YongSu Ham, Seoul (KR); TaeHeon Kim, Seoul (KR); KyungYeol Ryu, Goyang-si (KR); MyungJin Lim, Goyang-si (KR); SeulGi Choi, Incheon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/822,188

(22) Filed: Nov. 26, 2017

(65) Prior Publication Data
US 2018/0150151 A1    May 31, 2018

(30) Foreign Application Priority Data

Nov. 29, 2016 (KR) .......................... 10-2016-0160723

(51) Int. Cl.
*G06F 3/01* (2006.01)
*G06F 3/041* (2006.01)
*C09D 127/16* (2006.01)
*H01L 41/193* (2006.01)

(52) U.S. Cl.
CPC ........... *G06F 3/041* (2013.01); *C09D 127/16* (2013.01); *G06F 3/016* (2013.01); *H01L 41/193* (2013.01)

(58) Field of Classification Search
None
See application file for complete search history.

(56) References Cited

U.S. PATENT DOCUMENTS

2001/0026636 A1    10/2001  Mainguet
2004/0263483 A1*   12/2004  Aufderheide ....... G06F 3/03545
                                                        345/173

FOREIGN PATENT DOCUMENTS

| KR | 10-0273506 B1 | 12/2000 |
| KR | 100 023 792 B1 | 3/2011 |
| KR | 10-2016-0080955 A | 7/2016 |
| WO | 2011/008940 A1 | 1/2011 |
| WO | 2015/077200 A1 | 5/2015 |

OTHER PUBLICATIONS

Poulsen, Matthew and Ducharme, Stephen, "Why Ferroelectric Polyvinylidene Fluoride is Special". Stephen Ducharme Publications. Paper 67. IEEE Transactions on Dielectrics and Electrical Insulation vol. 17, No. 4; Aug. 2010.
Database WPI, Week 201155, Thomson Scientific, London, GB; AN 2011-D34107, XP002778871, & KR 100 023 792 B1 (Para Co Ltd) Mar. 21, 2011 (Mar. 21, 2011) * abstract *.
Poulsen M. et al: "Investigation of ferroelectricity in poly(methyl vinylidene cyanide)", Ferroelectric Letters, vol. 32, 2005, pp. 91-97, XP002778872.
Extended European Search Report dated Mar. 22, 2018 for corresponding application EP 17 20 4031.3.

* cited by examiner

*Primary Examiner* — Brian M Butcher
(74) *Attorney, Agent, or Firm* — Polsinelli PC

(57) ABSTRACT

The present disclosure related to a touch sensitive element and a display device including the same. The touch sensitive element according to an exemplary aspect of the present disclosure includes an electroactive film which is formed of a polyvinylidene fluoride (PVDF) based polymer and a cyanide (CN) based polymer.

12 Claims, 10 Drawing Sheets

TOUCH SENSITIVE ELEMENT AND DISPLAY DEVICE INCLUDING THE SAME

CROSS-REFERENCE TO RELATED APPLICATION

This application claims the benefit of Korean Patent Application No. 10-2016-0160723 filed on Nov. 29, 2016, in the Korean Intellectual Property Office, which is hereby incorporated by reference in its entirety.

BACKGROUND

Field of the Disclosure

The present disclosure relates to a display device, and more particularly, to a touch sensitive element and a display device including the same. Although the present disclosure is suitable for a wide scope of applications, it is particularly suitable for improving piezoelectricity and light transmissibility of a touch sensitive element and a display device including the same.

Description of the Background

Recently, in response to a demand of users who want to conveniently use various display devices including a liquid crystal display device and an organic light emitting display device, a touch type display device which a user touches a display device to input information is broadly used. Therefore, researches are continued to utilize a haptic device to provide direct and various tactile feedbacks to the users.

a vibration motor such as an eccentric rotating mass (ERM) or a linear resonant actuator (LRA) has been used for the display device as a haptic device. The vibration motor is a mean to vibrate the entire display device. Therefore, there have been problems in that a size of a mass needs to be increased in order to increase a vibration strength, it is difficult to modulate a frequency to adjust a level of the vibration, a response speed is very slow, and it is not appropriate to be used for the flexible display device.

In order to solve the above-described problems, a shape memory alloy (SMA) and electroactive ceramics (EAC) have been developed as a material for the haptic device. However, the shape memory alloy (SMA) has a slow response speed, a short lifespan, and is opaque and the electroactive ceramics (EAC) are brittle. Thus, it is difficult to apply the shape memory alloy and the electroactive ceramics to the display device, specifically, to the flexible display device.

Therefore, recently, a haptic device technology using an electroactive polymer (EAP) has attracted attention. The electroactive polymer is a polymer which may be deformed by an electrical stimulation and may repeatedly expand and be contracted and bent due to an electrical stimulation. A ferroelectric polymer among various types of electroactive polymers is mainly used. For example, the ferroelectric polymer includes a poly vinylidene fluoride (PVDF) based polymer.

The PVDF is a polymer having a crystallinity of 50% and a piezoelectricity thereof is based on the n-crystal region. Various researches for improving a β-crystal region and a permittivity to improve the piezoelectricity of the PVDF have been conducted and additives such as multi-wall carbon nano tube (MWCNT) or BaTiO3 have been introduced. However, due to the introduction of the MWCNT, there is a problem in that when a content of MWCNT exceeds a certain limit, the depolarization due to the increase of the electrical conductivity proceeds and consequently, the β-crystal region of PVDF is reduced. Further, when a ceramic material such as BaTiO3 is added, there is a problem in that the light transmittance is deteriorated or a dispersion property becomes poor.

Therefore, studies on an electroactive polymer or an electroactive film which may improve the piezoelectricity of a haptic device without deteriorating other properties such as light transmittance are required.

SUMMARY

The present disclosure is to provide a touch sensitive element which may improve the piezoelectricity without deteriorating light transmissibility and a display device including the same.

The present disclosure does not limit to the above-mentioned, which is not mentioned above, can be clearly understood by those skilled in the art from the following descriptions.

According to an aspect of the present disclosure, a touch sensitive element includes an electroactive film which is formed of a polyvinylidene fluoride (PVDF) based polymer and a cyanide (CN) based polymer.

According to another aspect of the present disclosure, there is provided a display device including a display panel, a touch panel, and a touch sensitive element. The touch sensitive element includes an electroactive film which is formed of a polyvinylidene fluoride (PVDF) based polymer and a cyanide (CN) based polymer.

According to a further aspect of the present disclosure, there is provided a touch sensitive element comprising an electroactive film essentially consisting of a polyvinylidene fluoride (PVDF) based polymer as a main material, a cyanide (CN) based polymer as an additive, and cyclopentanone as a solvent.

Other detailed matters of the exemplary aspects are included in the detailed description and the drawings.

According to the present disclosure, an electroactive film in which a CN based polymer is added to a PVDF based polymer is configured to provide a touch sensitive element with an improved piezoelectricity without significantly degrading a light transmissibility.

Further, according to the present disclosure, a display device including a touch sensitive element with improved piezoelectricity and the light transmissibility is configured to improve a tactile perception effect of the display device.

Further, according to the present disclosure, an electroactive film having a high permittivity is configured to provide a touch sensitive element in which a driving voltage is low and a vibration strength is improved.

The effects according to the present disclosure are not limited to the contents exemplified above, and more various effects are included in the present specification.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
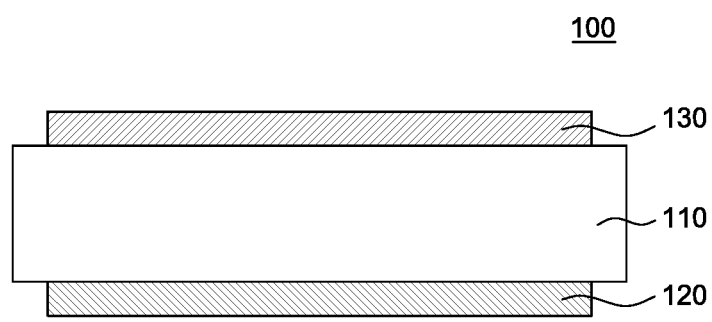
FIG. 1 is a schematic cross-sectional view of a touch sensitive element according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to exemplary aspect disclosed herein but will be implemented in various forms. The exemplary aspects are provided by way of example only so that a person of ordinary skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly" is not used.

When an element or layer is disposed "on" other element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely bonded to or combined with each other and can be interlocked and operated in technically various ways as understood by those skilled in the art, and the aspects can be carried out independently of or in association with each other.

Hereinafter, various exemplary aspects of the present disclosure will be described in detail with reference to accompanying drawings.

FIG. 1 is a schematic cross-sectional view of a touch sensitive element according to an exemplary aspect of the present disclosure.

Referring to FIG. 1, a touch sensitive element 100 according to an exemplary aspect of the present disclosure includes an electroactive film 110, a first electrode 120 disposed below the electroactive film 110, and a second electrode 130 disposed on the electroactive film 110.

The electroactive film 110 is interposed between the first electrode 120 and the second electrode 130 to cause vibration or bending by an electrical stimulation.

The electroactive film 110 of the present exemplary aspect may be formed of a polyvinylidene fluoride (PVDF) based polymer and a cyanide (CN) based polymer.

Specifically, the PVDF based polymer is an electroactive polymer (EAP) in which vibration is generated when a voltage is applied.

For example, the PVDF based polymer may include one of PVDF, a PVDF based copolymer, and a PVDF based terpolymer, but is not limited thereto.

The PVDF copolymer is a polymer formed of two kinds of monomers and for example, uses P (VDF-TrFE)(poly (vinylidene fluoride-trifluoroethylene)). The PVDF based terpolymer is a polymer formed of three kinds of monomers and is advantageous because it does not involve a dangerous poling process unlike the PVDF. The poling process is a process of applying a high DC voltage to the polymer to arrange atoms having a specific charge in one direction. For example, the PVDF based terpolymer may be P(VDF-TrFE-CFE)(poly(vinylidene fluoride-trifluoroethylene-chlorofluoroethylene) or P(VDF-TrFE-CTFE)(poly(vinylidene fluoride-trifluoroethylene-chlorotrifluoroethylene).

However, the PVDF based polymer has problems in a high applied voltage and a relatively low vibration characteristic. Therefore, in the present exemplary aspect, in order to improve the low vibration characteristic of the PVDF based polymer, a CN based polymer is introduced to the PVDF based polymer, as an additive. A configuration and an effect thereof will be described below.

The CN based polymer of the present exemplary aspect is used as an additive to improve a piezoelectricity of the electroactive film 110. Such a CN based polymer is advantageous in that a permittivity (high-k) is higher than that of the PVDF based polymer, compatibility at the time of being mixed with the PVDF based polymer is excellent, and the light transmissibility is not deteriorated.

Generally, in order to improve the piezoelectricity of the touch sensitive element, a piezoelectric constant needs to be increased. Further, in order to increase the piezoelectric constant, a permittivity and a polarization value need to be increased. This is because as represented in Equations 1 and 2, the piezoelectricity is proportional to the piezoelectric constant and the piezoelectric constant is proportional to the permittivity and the polarization.

$$F \propto N\left(\frac{S}{L}\right) Y d_{33} V \quad \text{[Equation 1]}$$

(where F is a resisting force of a piezo actuator when a load is applied, N is a number of laminated actuators, S is a cross-section of the actuator, L is a length of the actuator, Y is Young's modulus, $d_{33}$ is a piezoelectric constant, and V is an applied voltage.)

$$d_{33} \propto 2\varepsilon P_3 \quad \text{[Equation 2]}$$

(where $d_{33}$ is a piezoelectric constant, $\varepsilon$ is a dielectric constant, and $P_3$ is polarization.)

Therefore, the CN based polymer having a higher dielectric property than the PVDF based polymer is added so that the piezoelectricity of the electroactive film 110 can be improved.

For example, such a CN based polymer may be PVDCN (polyvinylidene cyanide) represented by the following Chemical Formula 1 or PMVC(poly(methylvinylidene cyanide)) represented by the following Chemical Formula 2.

[Chemical Formula 1]

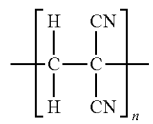

In Chemical Formula 1, n is an integer of 6 to 10.

In Chemical Formula 1, n may be selected from an appropriate range in consideration of a compatibility and a physical property at the time of being mixed with the PVDF based polymer and accordingly, a molecular weight of the PVDCN may be in the range of 400 to 800.

In the above description, when n is smaller than 6, the molecular weight is too small and the PVDCN is a liquid at a room temperature so that it is difficult to use the PVDCN. In contrast, when n exceeds 10, the efficiency of contribution of dipole moments per every unit may be drastically reduced. This is because since the CN based polymer has a small radius of curvature due to a repulsive force of a substituent non-shared electron pair, the larger the molecular weight, the more the total dipole moment canceled. Generally, a radius of curvature of the PVDF is 30.0 Å and a radius of curvature of PVDCN is 8.5 Å.

[Chemical Formula 2]

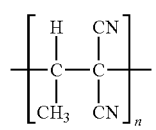

In Chemical Formula 2, n is an integer of 6 to 20.

Similar to Chemical Formula 1, in Chemical Formula 2, n may be selected appropriately in the level of oligomer in consideration of a compatibility and a physical property at the time of being mixed with the PVDF based polymer and accordingly, a molecular weight of the PMVC may be in the range of 500 to 2000. The reason why the range of n is limited in Chemical Formula 2 is the same as Chemical Formula 1 and a radius of curvature of PMVC is generally 12.6 ÅA.

The PVDCN may be produced by a reaction mechanism of the following Reaction Formula 1.

[Reaction Formula 1]

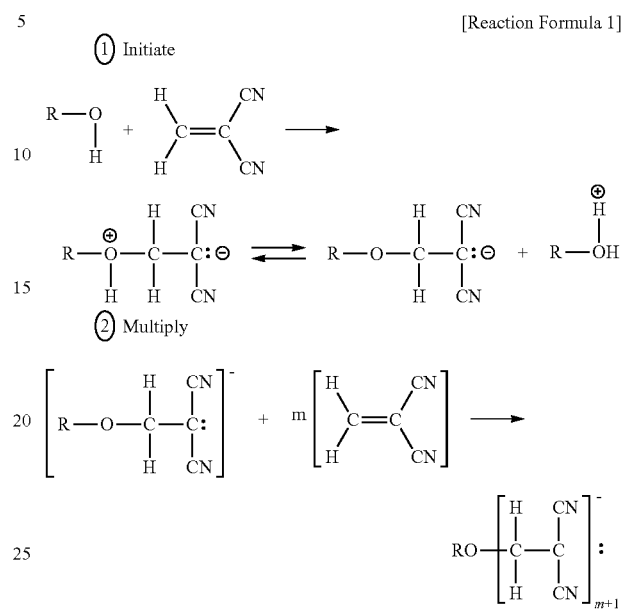

According to Reaction Formula 1, alcohol (ROH) and vinylidene cyanide (VDCN) are reacted with an ionic catalyst and then dehydrogenated to produce RO-VDCN-. Thereafter, a process of causing the produced RO-VDCN- to react with the VDCN is repeated.

The PMVC may be produced by a reaction mechanism of Reaction Formula 2.

[Reaction Formula 2]

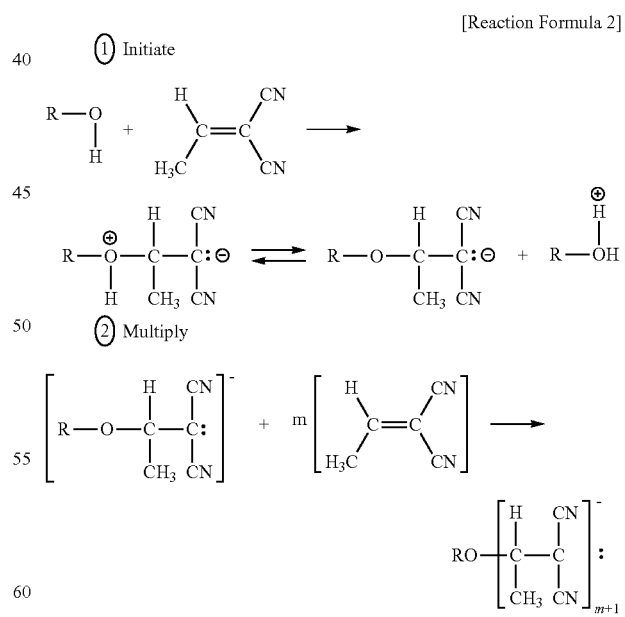

According to Reaction Formula 2, alcohol (ROH) and methyl vinylidene cyanide (MVDCN) are reacted with an ionic catalyst and then dehydrogenated to produce RO-MVDCN-. Thereafter, a process of causing the produced RO-MVDCN- react with the MVDCN is repeated.

The CN-based polymers such as PVDCN and PMVC may improve the piezoelectric characteristics by using a C—N bond having a larger dipole moment value than a C—F bond of the PVDF.

This is because a high dipole moment of the polymer increases a polarization value of the polymer and the piezoelectricity is proportional to the polarization value as represented in the above-described Equations 1 and 2.

From a viewpoint of improving the piezoelectricity of the electroactive film 110, for example, the CN based polymer may be added in an amount of 0.1 weight % to 2.2 weight % with respect to the total weight of a composition of the electroactive film 110. The CN based polymer may be added in the amount of 0.7 weight % to 1.8 weight % with respect to the total weight of a composition of the electroactive film 110. In this case, when the added amount of the CN based polymer is less than 0.1 weight %, the piezoelectric improvement effect may be insufficient. In contrast, when the added amount of the CN based polymer exceeds 2.2 weight %, the light transmissivity may be deteriorated. In the present disclosure, the composition of the electroactive film may include the PVDF based polymer, the CN based polymer, and a solvent for mixing the polymers.

In the electroactive film 110 configured as described above, the permittivity and the vibration strength may be improved by adding the CN-based polymer exhibiting a higher dielectric characteristic and polarization characteristic than the PVDF-based polymer. Accordingly, the electroactive film 110 may satisfy characteristics in that a vibration acceleration at a voltage of 400 V is 0.82 G to 3.0 G and a permittivity at a frequency of 100 Hz is 55.1 to 100. When the vibration acceleration and the permittivity of the electroactive film 110 satisfy the above ranges, the vibration strength of the touch sensitive element 100 may be improved while lowering the driving voltage.

However, in the above description, when the vibration acceleration of the electroactive film 110 is lower than 0.82 G or the permittivity is lower than 55.1, the vibration strength improving effect may be insufficient. In the meantime, when a content and a material characteristic of the CN based polymer, a thickness of the electroactive film 110, and the like are considered, it is difficult to implement an electroactive film in which the vibration acceleration exceeds 3.0 G or the permittivity exceeds 100.

Further, the electroactive film 110 may satisfy a characteristic in that the light transmittance is 89.1% or higher. Generally, in order to dispose the touch sensitive element on a front surface of the display panel, the light transmittance of the touch sensitive element needs to be 80% or higher. The electroactive film 110 of the present exemplary aspect may serve as a touch sensitive element having excellent permittivity and light transmittance, so that a touch sensitive element which may be disposed above the display panel may be manufactured and thus finally, a direct tactile feedback may be transmitted to the user.

An example of a manufacturing method of an electroactive film 110 of the present exemplary aspect will be described below. First, a predetermined amount of PVDF based polymer and CN based polymer are put into a soluble solvent such as cyclo-pentanone to have the above-mentioned composition range and then mixed to produce a mixture. Thereafter, the mixture is coated on the first electrode 120 using a spin-coating method to form a coating film. Next, the coating film is hardened at a temperature of 50° C. to 100° C. for 5 minutes to 30 minutes, dried at a temperature of 80° C. to 150° C. for 10 minutes to 30 minutes, and then thermally processed at a temperature of 100° C. to 150° C. for 20 minutes to 30 minutes in this order. However, the soluble solvent, the hardening condition, the drying condition, the thermal processing condition, and the coating method are not limited thereto, but any appropriate condition which is known in the art may be employed.

An addition of the CN based polymer of the electroactive film 110, for example, PMVC can be verified by GPC, XRD, 1H-NMR, 13C-NMR, FT-IR, and Raman analysis of the following FIGS. 2 to 7.

Figure 2:
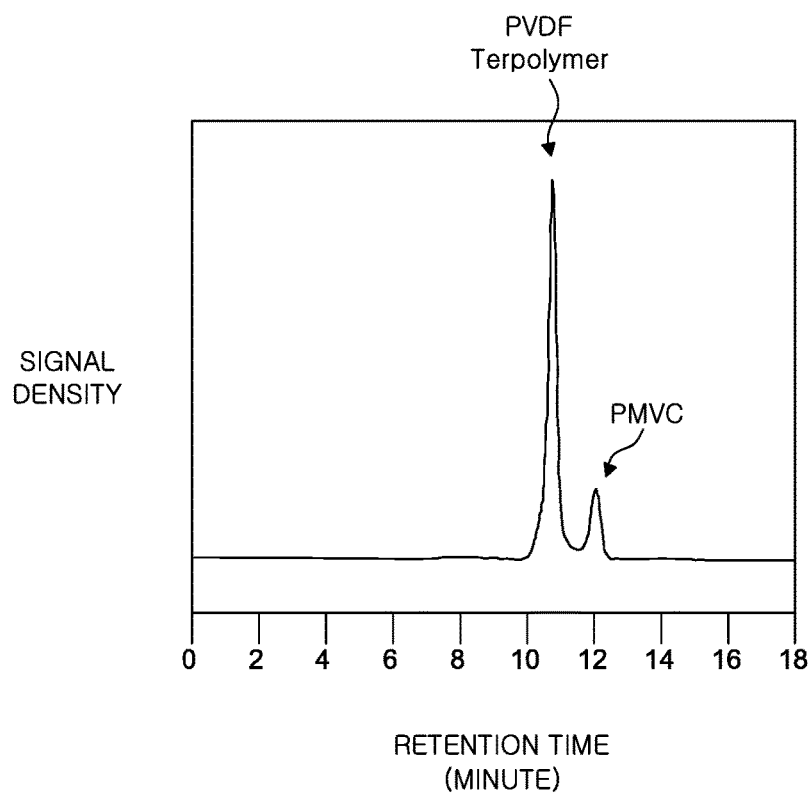
FIG. 2 illustrates a GPC analysis result of an electroactive film of the present disclosure.

FIG. 2 illustrates a gel permeation chromatography (GPC) analysis result of an electroactive film of the present disclosure.

Referring to FIG. 2, a retention time (RT) of the PMVC appears around twelfth minute at the time of GPC measurement. This is because since a retention time of the PVDF having a large amount and a large molecular weight is short, the PVDF appears early and a signal density is large, and since a retention time of PMVC having a small molecular weight and a small amount is long, the PMVC appears late and a signal density is small. At the time of GPC measurement, RT indicates an intrinsic polarity of the material. A material having RT of around twelfth minute is PMVC. Therefore, it is confirmed that PMVC is added to the electroactive film 110 by means of the GPC measurement.

Figure 3:
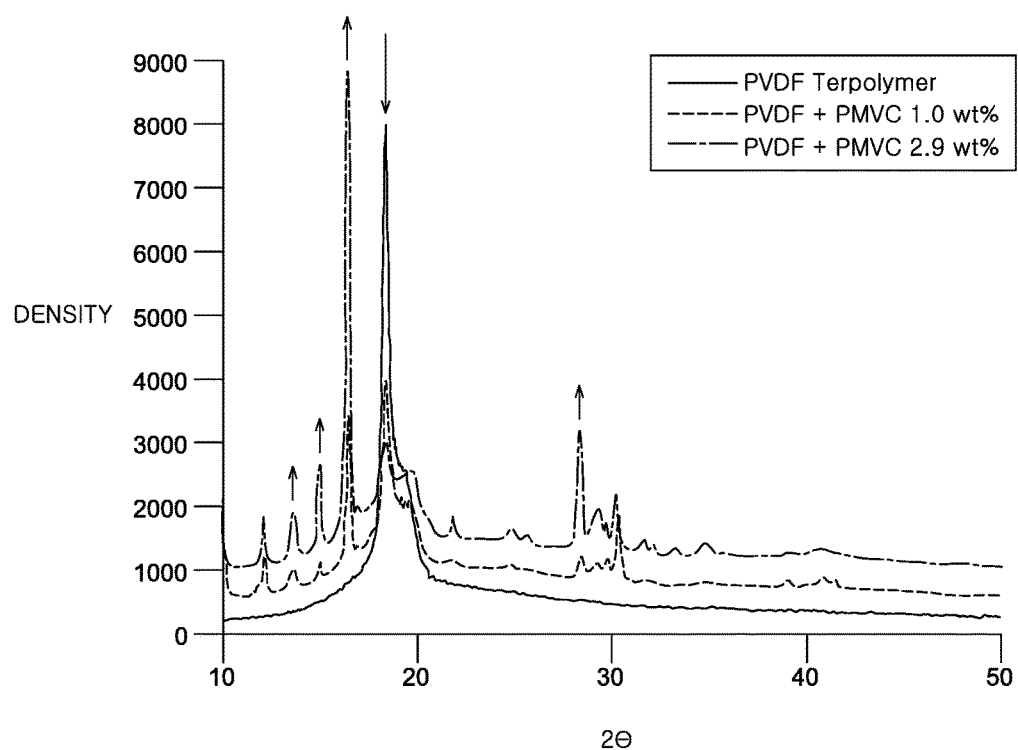
FIG. 3 illustrates an XRD analysis result of an electroactive film of the present disclosure.

FIG. 3 illustrates an X-ray diffraction (XRD) analysis result of an electroactive film of the present disclosure.

Referring to FIG. 3, it is understood that a peak is decreased at 18.4 deg. and peaks are generated at 13.7 deg., 15.0 deg., 16.4 deg., and 28.4 deg. This is because a crystal structure of the PVDF polymer is changed by adding the PMVC so that a unique peak change is represented in the XRD crystal structure analysis. By doing this, it is possible to estimate whether the PMVC is added.

Figure 4:
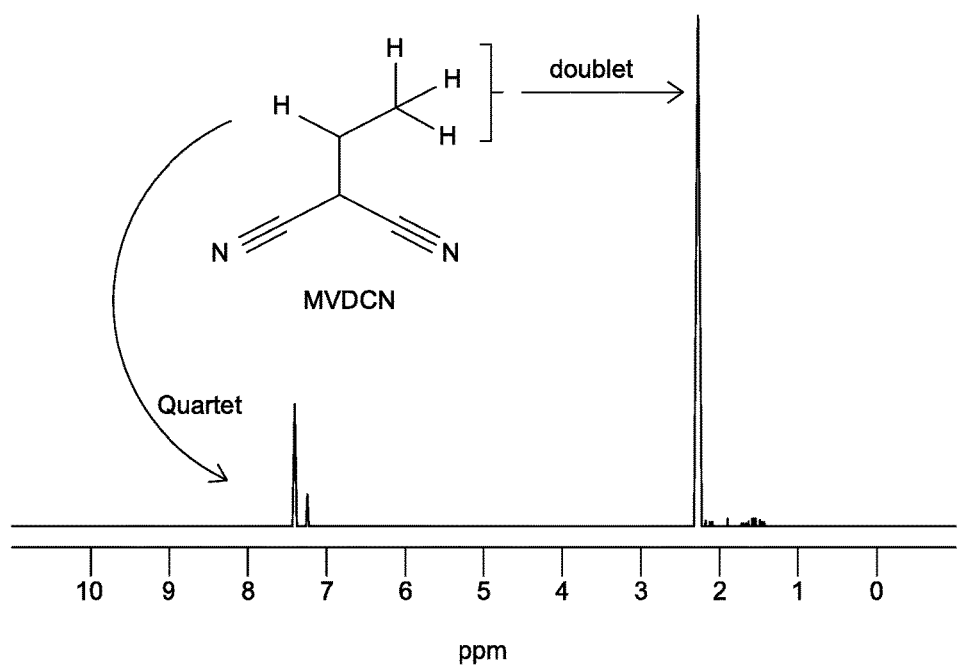
FIG. 4 illustrates a 1H-NMR analysis result of an electroactive film of the present disclosure.
Figure 5:
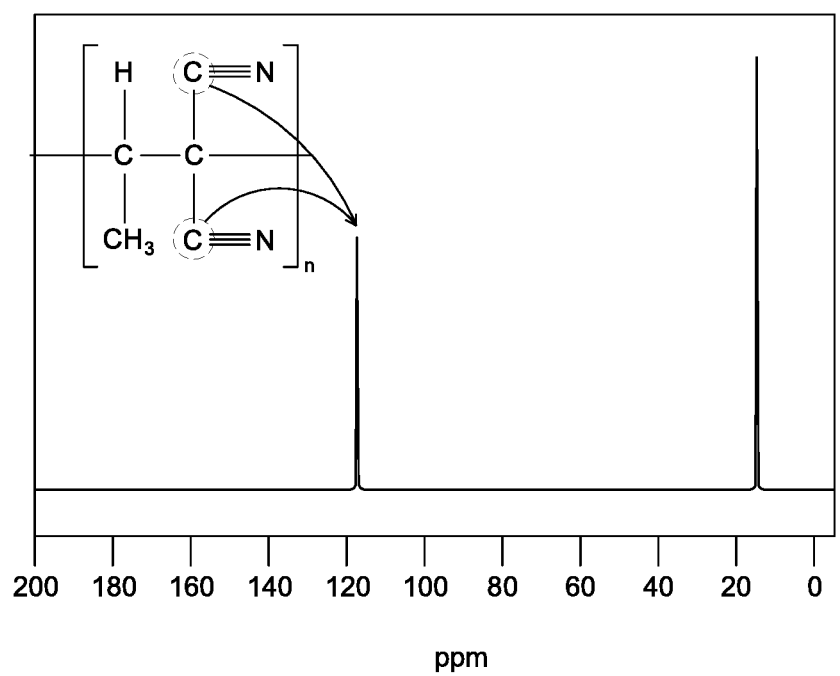
FIG. 5 illustrates a 13C-NMR analysis result of an electroactive film of the present disclosure.

FIG. 4 illustrates a proton nuclear magnetic resonance (1H-NMR) analysis result of an electroactive film of the present disclosure and FIG. 5 illustrates a carbon-13 nuclear magnetic resonance (13C-NMR) analysis result of an electroactive film of the present disclosure.

Referring to FIGS. 4 and 5, a specific peak of the sample is observed, and in particular, it is understood that a peak at approximately 120 ppm in FIG. 5 is a C≡N bond. This is because carbon of the nitrile group (—C≡N) has strong peaks at 100 ppm or higher due to strong electro-spin characteristics.

Figure 6:
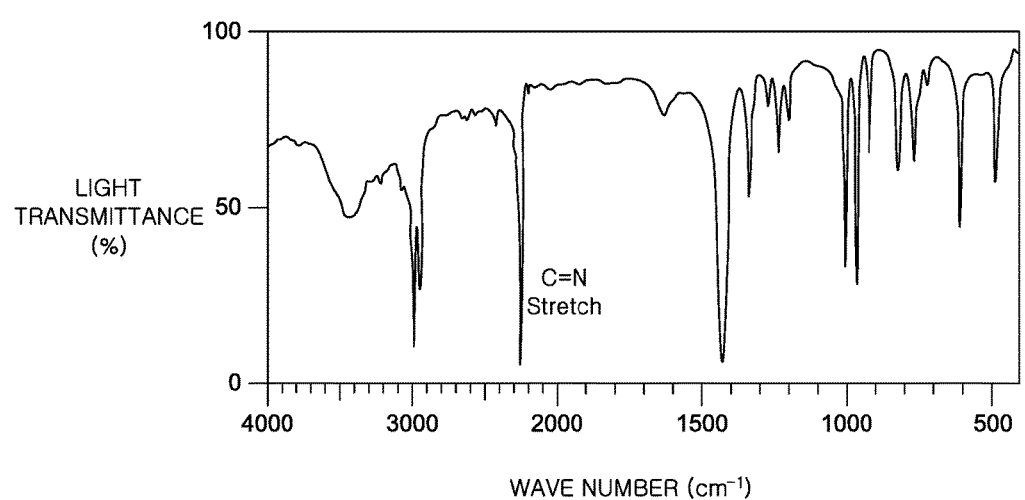
FIG. 6 illustrates a FT-IR analysis result of an electroactive film of the present disclosure.
Figure 7:
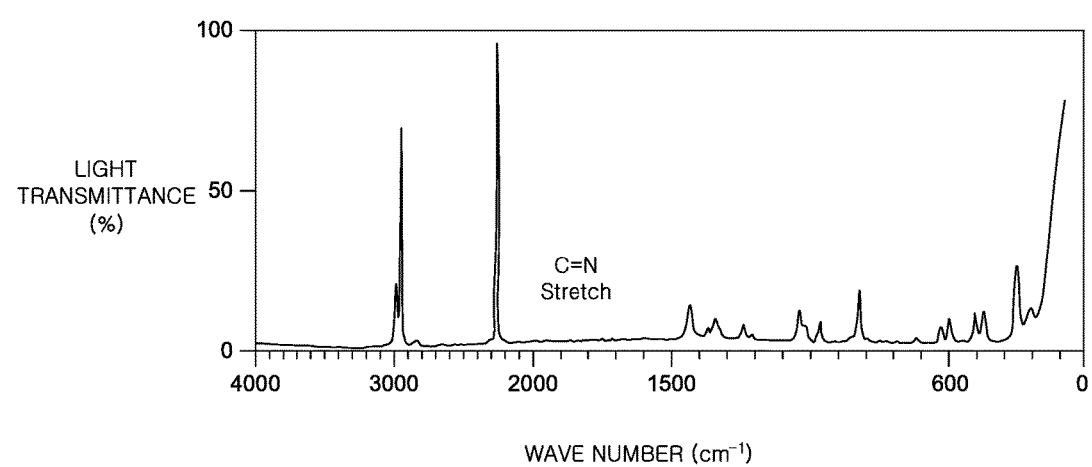
FIG. 7 illustrates a Raman analysis result of an electroactive film of the present disclosure.

FIG. 6 illustrates a Fourier transform infrared spectroscopy (FT-IR) analysis result of an electroactive film of the present disclosure and FIG. 7 illustrates a Raman analysis result of an electroactive film of the present disclosure.

Referring to FIG. 6, an IR absorption peak is observed at approximately 2250 cm-1 and referring to FIG. 7, a Raman scattered light peak is observed at approximately 2240 cm-1. This is a unique peak due to C≡N Stretch of the nitrile group and by doing this, it is possible to estimate whether the PMVC is added.

Referring to FIG. 1 again, a first electrode 120 and a second electrode 130 are attached on both surfaces of the electroactive film 110 to supply a power. The first electrode 120 and the second electrode 130 may be formed of a conductive material, but are not limited thereto. For example, the first electrode 120 and the second electrode 130 may be formed of a metal material such as gold (Au), copper (Cu), titanium (Ti), chrome (Cr), molybdenum (Mo), aluminum (Al), and an aluminum-copper alloy (Al—Cu alloy). Further, the first electrode 120 and the second electrode 130 may be formed of a conductive polymer such as PEDOT [Poly(3,4-EthyleneDiOxyThiophene)]:PSS[Poly(4-Styrene-Sulfonic acid)], polypyrrole, and polyaniline.

Further, the first electrode 120 and the second electrode 130 may be formed of a soft electrode which is manufactured by mixing an elastic body to carbon conductive grease, carbon black or carbon nano tube (CNT) so as to be appropriate for smooth repeated driving of the touch sensitive element 100. The first electrode 120 and the second electrode 130 may be formed of the same material or formed of different materials.

In the meantime, when the touch sensitive element 100 of the present disclosure is disposed on the display panel, the first electrode 120 and the second electrode 130 may include a transparent conductive material to secure transparency of the touch sensitive element. However, the first electrode 120 and the second electrode 130 are not limited thereto and the transparent conductive material may include one of indium tin oxide (ITO), graphene, a metal nano wire, and transparent conductive oxide (TCO).

Figure 10:
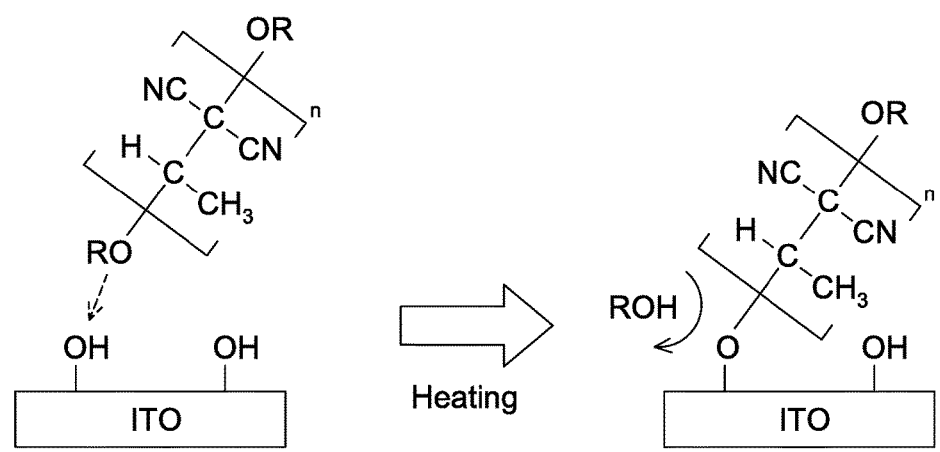
FIG. 10 is a reaction formula illustrating a chemical bond between an OH group on an ITO surface and a RO group of PVDCN or PMVC terminal group.

When at least one of the first electrode 120 and the second electrode is formed as an ITO electrode, an adhesiveness of the electroactive film 110 with the ITO electrode may be improved. As illustrated in FIG. 10, this is due to the fact that the OH group on the ITO surface and a RO group of the PVDCN or PMVC terminal group form a chemical bond by the condensation reaction. Therefore, the electroactive film 110 may satisfy a characteristic in that the adhesiveness with the ITO electrode is 1.42 N or higher. The adhesiveness of the electroactive film 110 with the ITO electrode may be 1.42 N to 3 N. That is, the adhesiveness of the electroactive film 110 with the ITO electrode is improved to be 1.42 N or higher by the chemical bond represented in the following Reaction Formula 3. However, when a strength of the chemical bond represented in the following Reaction Formula 3 and an adhered area between the electroactive film 110 and the ITO electrode are considered, the adhesiveness between the electroactive film 110 and the ITO electrode may not exceed 3 N.

The first electrode 120 and the second electrode 130 are disposed on both surfaces of the electroactive film 110 by various methods. For example, the first electrode 120 and the second electrode 130 may be disposed on both surfaces of the electroactive film 110 by methods such as a sputtering, printing, and slit coating method. Specifically, when the first electrode 120 and the second electrode 130 are formed of the same material, the first electrode 120 and the second electrode 130 may be simultaneously disposed.

A voltage is applied to the first electrode 120 and the second electrode 130 from the outside to form an electric field. Here, in order to form an electric field in the electroactive film 110, voltages with different magnitudes or voltages having opposite electrical properties may be applied to the first electrode 120 and the second electrode 130. For example, when a positive (+) voltage is applied to one of the first electrode 120 and the second electrode 130, a negative (−) voltage or a ground voltage may be applied to the other electrode.

Further, the voltage which is applied to the first electrode 120 and the second electrode 130 may be an AC voltage or a DC voltage. When the AC voltage is applied to the first electrode 120 and the second electrode 130, the electroactive film 110 may be periodically displaced, so that a vibrating effect may be achieved. When the DC voltage is applied to the first electrode 120 and the second electrode 130, the electroactive film 110 may maintain a bent state.

The touch sensitive element 100 configured as described above may lower the driving voltage and improve the piezoelectricity without substantially lowering the light transmittance, using the electroactive film 110 with excellent permittivity, vibration strength, and light transmittance by adding the CN based polymer which exhibits higher dielectric and polarization characteristics than the PVDF based polymer.

Figure 8:
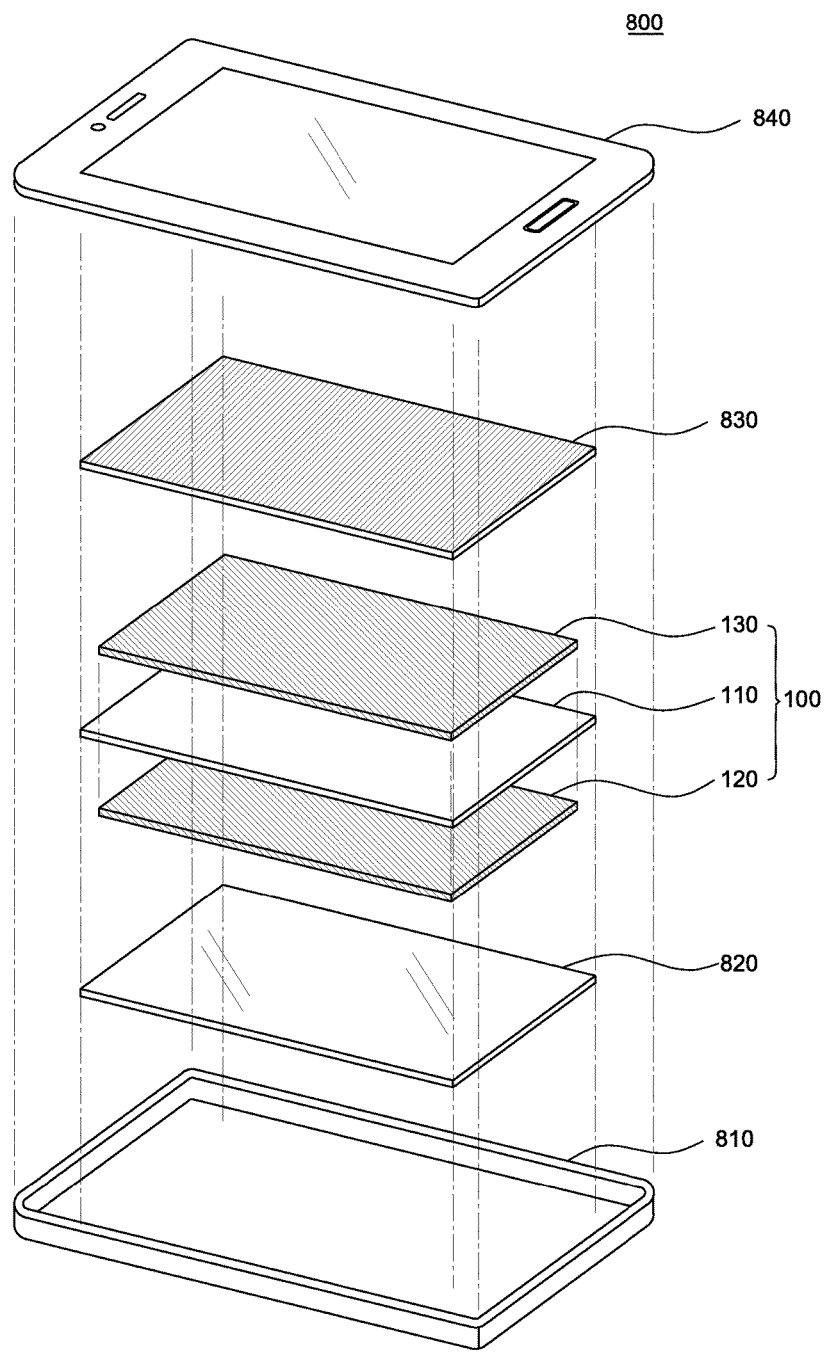
FIG. 8 is a schematic exploded perspective view of a display device including a touch sensitive element according to an exemplary aspect of the present disclosure.

FIG. 8 is a schematic exploded perspective view of a display device including a touch sensitive element according to an exemplary aspect of the present disclosure.

Referring to FIG. 8, a display device 800 according to an exemplary aspect of the present disclosure includes a lower cover 810, a display panel 820, a touch sensitive element 100, a touch panel 830, and an upper cover 840.

The lower cover 810 is disposed below the display panel 820 so as to cover lower portions of the display panel 820, the touch sensitive element 100, and the touch panel 830. The lower cover 810 protects internal configurations of the display device 800 from the external impact or penetration of a foreign substance or moisture. For example, the lower cover 810 may be formed of plastic which is thermally formed and has a good workability or a material which may be deformed in accordance with shape deformation of the display device 800, but is not limited thereto.

The display panel 820 may refer to a panel in which a display element for displaying an image in the display device 800 is disposed. As the display panel 820, for example, various display panels such as an organic light emitting display panel, a liquid crystal display panel, and an electrophoretic display panel may be used. The organic light emitting display device may be a display device which flows current to an organic light emitting layer to allow the organic light emitting layer to emit light and emits light having a specific wavelength using the organic light emitting layer. The organic light emitting display device may include at least a cathode, an organic light emitting layer, and an anode.

The organic light emitting display device may be configured to have ductility and be deformed. That is, the organic light emitting display device may be a flexible organic light emitting display device having ductility and includes a flexible substrate. The flexible organic light emitting display device may be deformed in various directions and angles by a force applied from the outside.

The touch sensitive element 100 may be disposed on the display panel 820. The touch sensitive element 100 may be disposed to be in direct contact with an upper surface of the display panel 820 or disposed between an upper surface of the display panel 610 and a lower surface of the display panel 820 using an adhesive. For example, as the adhesive, an optical clear adhesive (OCA) or an optical clear resin (OCR) may be used, but the adhesive is not limited thereto.

In the meantime, even though the touch sensitive element 100 disposed on the display panel 820 is illustrated in FIG. 8, the touch sensitive element 100 may be disposed below the display panel 820 as needed.

The touch sensitive element 100 illustrated in FIG. 8 includes a first electrode 120, a second electrode 130, and an electroactive film 110. Since the specific components of the touch sensitive element 100 are the same as the touch sensitive element 100 described with reference to FIG. 1, a detailed description will be omitted.

The touch sensitive element 100 may be electrically connected to the display panel 820. For example, a flexible printed circuit board (FPCB) disposed on the display panel 820 and an electrode of the touch sensitive element 100 may be electrically connected to each other by wiring lines.

The touch panel 830 is disposed on the touch sensitive element 100. The touch panel 830 may refer to a panel which performs a function of sensing a user's touch input to the display device 800 and providing a touch coordinate.

The touch panel 830 may be classified by an operating method. For example, a capacitive type, a resistive type, an ultrasonic type, an infrared type, or the like may be used. Among these, a capacitive type touch panel may be used as the touch panel 830.

Further, the touch panel 830 may be electrically connected to the touch sensitive element 100. Specifically, the touch panel 830 is electrically connected to the electrodes of the touch sensitive element 100 to transmit various touch signals or voltages input from the touch panel 830 to the touch sensitive element 100.

The upper cover 840 is disposed on the touch panel 830 so as to cover upper portions of the touch sensitive element 100, the display panel 820, and the touch panel 830. The upper cover 840 may perform the same function as the lower cover 810. Further, the upper cover 840 is also formed of the same material as the lower cover 810.

The display device 800 configured as described above improves the vibration strength and the light transmittance of the display device 800 using the electroactive film 110 with excellent piezoelectricity and light transmissibility to improve a tactile perception effect of the display device 800. Accordingly, characteristics of the electroactive film 110 are reflected to the display device 800 so that characteristics in that the vibration acceleration at a voltage of 400 V is 0.82 G to 3.0 G and light transmittance is 89.1% or higher are satisfied.

The display device 800 including the touch sensitive element 100 of the present exemplary aspect may be a mobile display device such as a smart phone, a mobile phone, a tablet PC, or a PDA, and may be a car navigation system, a TV, an outdoor signboard, a slot machine, an electronic whiteboard, or the like.

EXAMPLES

Hereinafter, a configuration and an action of the present disclosure will be described in more detail by means of an exemplary aspect. However, this is suggested as an exemplary aspect of the present disclosure, but may not be interpreted to limit the present disclosure in any meanings.

Contents which are not described herein may be sufficiently and technically deducted by those skilled in the art so that the description thereof will be omitted.

1. Preparation of Specimen

Specimens according to first to sixth exemplary aspects, and a first comparative aspect with 10 cm in width and 10 cm in length were prepared by preparing an electroactive film with a thickness of 15 μm using a composition represented in Table 1 and then forming an ITO film with a thickness of 20 nm on both surfaces of the electroactive film to cut the ITO film.

TABLE 1

| Classification | Chemical Component(Unit: weight %) | | |
| --- | --- | --- | --- |
| | Additive PMVC | Main material P(VDF-TrFE-CFE) | Sovent Cyclopentanone |
| First Comparative Aspect | 0.0 | 15.0 | 85.0 |
| First Examplary Aspect | 0.1 | 15.0 | 84.9 |
| Second Examplary Aspect | 0.7 | 14.9 | 84.4 |
| Third Examplary Aspect | 1.0 | 14.8 | 84.2 |
| Fourth Examplary Aspect | 1.5 | 14.8 | 83.7 |
| Fifth Examplary Aspect | 1.8 | 14.7 | 83.5 |
| Sixth Examplary Aspect | 2.2 | 14.7 | 83.1 |

2. Evaluation of Physical Property

Vibration accelerations of the electroactive films of the specimens according to the first to sixth exemplary aspects, and the first comparative aspect at every voltage at a frequency of 100 Hz were measured to evaluate a vibration characteristic. A measurement result was listed in Table 2.

Further, a light transmittance, a haze, a permittivity at a frequency of 100 Hz, and an adhesive strength with the ITO electrode of the electroactive films of the specimens according to the first to sixth exemplary aspects, and the first comparative aspect were measured. A measurement result was listed in Table 2.

However, the adhesive strength with the ITO electrode was measured as a force which is separated at 90 degrees in a state when the ITO electrode above the electroactive film was removed and a GLS coating film on which the ITO electrode is deposited and a hardened electroactive film were used. Specifically, the electroactive film was formed by spin-coating the composition of Table 1 on the ITO electrode at 500 rpm for 15 seconds to form a coating film, curing the coating film at 75° C. for 10 minutes, and then thermally processing the coating film at 120° C. for 30 minutes.

Further, spontaneous polarization values of the electroactive films of the specimens according to the fourth exemplary aspect and the first comparative aspect at a voltage of 115 V were measured and the measurement results were represented in Table 3. In this case, the polarization behavior according to the electric field of the P(VDF-TrFE-CFE) polymer used for the electroactive film of the specimen according to the fourth exemplary aspect was represented in FIG. 9.

TABLE 2

| Classification | Permittivity $\varepsilon_r$(100 Hz) | Vibration acceleration (G@400 V) | Light transmittance (%) | Haze | Adhesive strength with ITO electrode (N) |
| --- | --- | --- | --- | --- | --- |
| First Comparative Aspect | 50.0 | 0.72 | 90.1 | 0.7 | 0.77 |
| First Exampelary Aspect | 55.1 | 0.82 | 92.2 | 1.0 | 1.42 |
| Second Exampelary Aspect | 57.5 | 1.12 | 91.1 | 1.1 | 1.72 |
| Third Exampelary Aspect | 58.0 | 1.20 | 90.8 | 1.1 | 1.87 |
| Fourth Exampelary Aspect | 58.9 | 1.23 | 90.4 | 1.2 | 1.95 |

TABLE 2-continued

| Classification | Permittivity ε_r(100 Hz) | Vibration acceleration (G@400 V) | Light transmittance (%) | Haze | Adhesive strength with ITO electrode (N) |
|---|---|---|---|---|---|
| Fifth Exampelary Aspect | 57.3 | 1.05 | 89.2 | 1.2 | 2.15 |
| Sixth Exampelary Aspect | 55.2 | 0.95 | 89.1 | 1.3 | 2.01 |

Referring to Table 2, it was understood that the permittivity and the vibration acceleration of the electroactive films of the first to sixth exemplary aspects were considerably improved as compared with the permittivity and the vibration acceleration of the electroactive film of the first comparative aspect. In this case, the electroactive films of the first to sixth exemplary aspects exhibited characteristics in that the permittivity at a frequency of 100 Hz was 55.1 or higher and a vibration acceleration at a voltage of 400 V was 0.82 G or higher.

Further, it was understood that the adhesive strength with the ITO electrode of the electroactive films of the first to sixth exemplary aspects was considerably improved as compared with the adhesive strength with the ITO electrode of the electroactive film of the first comparative aspect. The adhesive strength with the ITO film of the electroactive films of the first to sixth exemplary aspects was 1.42 N or higher.

However, the light transmittance of all the electroactive films of the first to sixth exemplary aspects were 89.1% or higher so that there is no significant difference as compared with the light transmittance of the electroactive film of the first comparative aspect.

As seen from the above experiment result, it was understood that in the electroactive film of the first to sixth exemplary aspects which satisfied the conditions suggested by the present disclosure, the permittivity, the vibration acceleration, and the adhesive strength with the ITO electrode were significantly improved without lowering the light transmittance, as compared with the first comparative aspect which did not satisfy the conditions.

Figure 9:
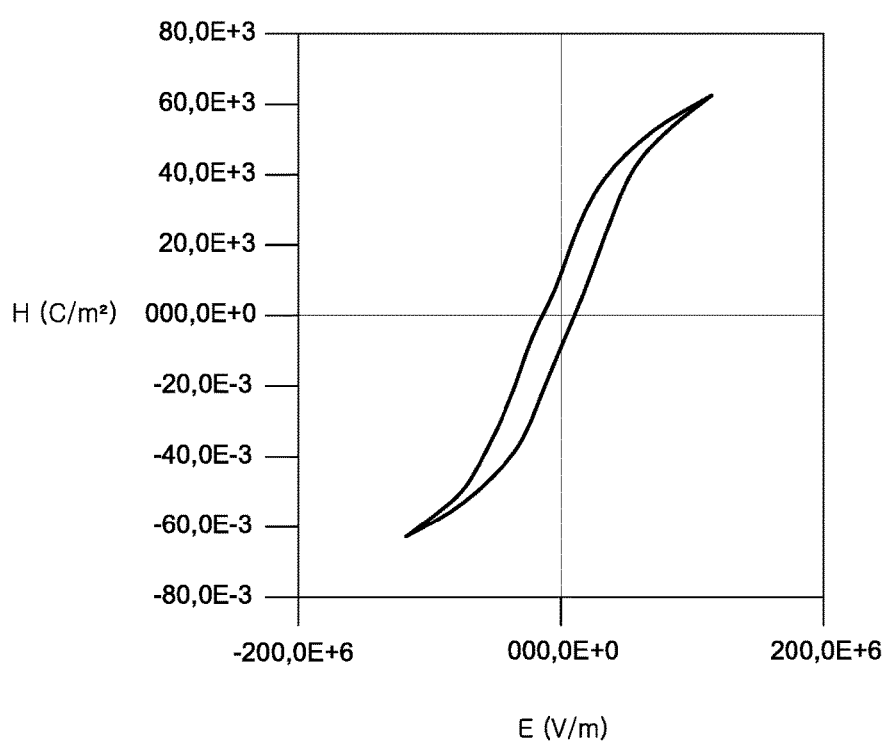
FIG. 9 is a graph illustrating a polarization behavior according to an electric field of P(VDF-TrFE-CFE) polymer used for an electroactive film of a fourth exemplary aspect of the present disclosure.

FIG. 9 is a graph illustrating a polarization behavior according to an electric field of P (VDF-TrFE-CTFE) polymer used for an electroactive film of a fourth exemplary aspect of the present disclosure.

TABLE 3

| Classification | First Comparative Aspect | Fourth Exampelary Aspect | Increased amount |
|---|---|---|---|
| Spontaneous polarization(mC/m²) | 53.46 | 64.5 | +20.7% |

Referring to Table 3 and FIG. 9, the electroactive film of the fourth exemplary aspect which satisfied the condition suggested by the present disclosure exhibited the characteristics in that the spontaneous polarization value at a voltage of 115 V was 64.5 mC/m2 and the spontaneous polarization value was increased by 20.7% as compared with the first comparative aspect in which the spontaneous polarization value was 53.46 mC/m2.

By doing this, it is understood that the electroactive film of the fourth exemplary aspect which satisfied the condition suggested by the present disclosure had an improved vibration characteristic by improving the polarization value as compared with the first comparative aspect which did not satisfy the conditions.

The exemplary aspects of the present disclosure can also be described as follows:

According to an aspect of the present disclosure, a touch sensitive element includes an electroactive film which is formed of a polyvinylidene fluoride (PVDF) based polymer and a cyanide (CN) based polymer.

A permittivity of the CN based polymer may be higher than a permittivity of the PVDF based polymer.

The CN based polymer may be polyvinylidene cyanide (PVDCN) represented by the following Chemical Formula 1 or poly(methylvinylidene cyanide) (PMVC) represented by the following Chemical Formula 2.

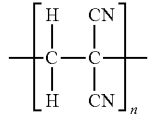

[Chemical Formula 1]

In Chemical Formula 1, n is an integer of 6 to 10.

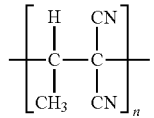

[Chemical Formula 2]

In Chemical Formula 2, n is an integer of 6 to 20.

An added amount of the CN based polymer may be 0.1 weight % to 2.2 weight % with respect to a total weight of a composition of the electroactive film.

A vibration acceleration of the electroactive film at a voltage of 400 V may be 0.82 G to 3.0 G.

A light transmittance of the electroactive film may be 89.1% or higher.

A permittivity of the electroactive film at a frequency of 100 Hz may be 55.1 to 100.

The PVDF based polymer may be at least one selected from PVDF, a PVDF based copolymer, and a PVDF based terpolymer.

The PVDF based terpolymer may be P(VDF-TrFE-CFE) (poly(vinylidene fluoride-trifluoroethylene-chlorofluoroethylene) or P(VDF-TrFE-CTFE)(poly(vinylidene fluoride-trifluoroethylene-chlorotrifluoroethylene).

The touch sensitive element may further include a first electrode disposed below the electroactive film, and a second electrode disposed on the electroactive film and at least one of the first electrode and the second electrode may be an ITO electrode, and an adhesive strength with the ITO electrode of the electroactive film may be 1.42 N to 3 N.

According to another aspect of the present disclosure, a display device includes a display panel, a touch panel, and a touch sensitive element, in which the touch sensitive element includes an electroactive film which is formed of a polyvinylidene fluoride (PVDF) based polymer and a cyanide (CN) based polymer.

A light transmittance may be 89.1% or higher, a permittivity at a frequency of 100 Hz may be 55.1 to 100, and a vibration acceleration at a voltage of 400 V may be 0.82 G to 3.0 G.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical spirit of the present disclosure. The scope of the technical spirit of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A touch sensitive element, comprising:
   an electroactive film which is formed of a polyvinylidene fluoride (PVDF) based polymer and a poly(methylvinylidene cyanide) (PMVC) represented by Chemical Formula 2,

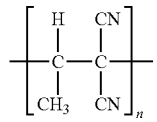
   [Chemical Formula 2]

In Chemical Formula 2, n is an integer of 6 to 20.

2. The touch sensitive element according to claim 1, wherein the poly(methylvinylidene cyanide) (PMVC) has a permittivity higher than a permittivity of the PVDF based polymer.

3. The touch sensitive element according to claim 1, wherein the poly(methylvinylidene cyanide) has a RO group (alkoxy group) as a terminal group.

4. The touch sensitive element according to claim 1, wherein the poly(methylvinylidene cyanide) (PMVC) is an amount of 0.1 weight % to 2.2 weight % with respect to a total weight of a composition of the electroactive film.

5. The touch sensitive element according to claim 1, wherein the electroactive film has a vibration acceleration in a range of 0.82 G to 3.0 G at a voltage of 400 V.

6. The touch sensitive element according to claim 1, wherein the electroactive film has a light transmittance of 89.1% or higher.

7. The touch sensitive element according to claim 1, wherein the electroactive film has a permittivity in a range of 55.1 to 100 at a frequency of 100 Hz.

8. The touch sensitive element according to claim 1, wherein the PVDF based polymer includes one of PVDF, a PVDF based copolymer, and a PVDF based terpolymer.

9. The touch sensitive element according to claim 8, wherein the PVDF based terpolymer includes one of P(VDF-TrFE-CFE)(poly(vinylidene fluoride-trifluoroethylene-chlorofluoroethylene) and P(VDF-TrFE-CTFE)(poly(vinylidene fluoride-trifluoroethylene-chlorotrifluoroethylene).

10. The touch sensitive element according to claim 1, further comprising:
    a first electrode and a second electrode facing each other and having the electroactive film between the first and second electrodes, wherein at least one of the first electrode and the second electrode is an ITO electrode, and an adhesive strength of the ITO electrode of the electroactive film is in a range of 1.42 N to 3 N.

11. A display device, comprising:
    a display panel;
    a touch panel; and
    a touch sensitive element including an electroactive film formed of a polyvinylidene fluoride (PVDF) based polymer and a poly(methylvinylidene cyanide) (PMVC) represented by Chemical Formula 2,

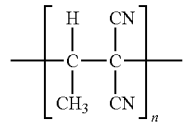
    [Chemical Formula 2]

In Chemical Formula 2, n is an integer of 6 to 20.

12. The display device according to claim 11, wherein the touch sensitive element has a light transmittance of 89.1% or higher, a permittivity of 55.1 to 100 at a frequency of 100 Hz, and a vibration acceleration of 0.82 G to 3.0 G at a voltage of 400 V.

* * * * *